(12) United States Patent
Murto et al.

(10) Patent No.: US 7,338,865 B2
(45) Date of Patent: Mar. 4, 2008

(54) METHOD FOR MANUFACTURING DUAL WORK FUNCTION GATE ELECTRODES THROUGH LOCAL THICKNESS-LIMITED SILICIDATION

(75) Inventors: Robert W. Murto, Austin, TX (US); Luigi Colombo, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 10/897,846

(22) Filed: Jul. 23, 2004

(65) Prior Publication Data

US 2006/0019437 A1    Jan. 26, 2006

(51) Int. Cl.
*H01L 21/8234* (2006.01)

(52) U.S. Cl. .......... 438/275; 438/517; 438/530; 438/532; 438/592; 438/655

(58) Field of Classification Search .......... 438/275, 438/517, 530, 532, 592, 655
See application file for complete search history.

(56) References Cited

U.S. PATENT DOCUMENTS

| | | | | |
|---|---|---|---|---|
| 5,679,585 | A * | 10/1997 | Gardner et al. | 438/655 |
| 6,174,775 | B1 * | 1/2001 | Liaw | 438/283 |
| 6,204,103 | B1 * | 3/2001 | Bai et al. | 438/224 |
| 6,784,060 | B2 * | 8/2004 | Ryoo | 438/275 |
| 6,835,639 | B2 * | 12/2004 | Rotondaro et al. | 438/592 |
| 6,841,441 | B2 * | 1/2005 | Ang et al. | 438/232 |
| 6,846,734 | B2 * | 1/2005 | Amos et al. | 438/592 |
| 6,864,163 | B1 * | 3/2005 | Yu et al. | 438/585 |
| 6,925,008 | B2 * | 8/2005 | Ichige et al. | 365/185.17 |
| 7,045,456 | B2 * | 5/2006 | Murto et al. | 438/649 |
| 7,148,546 | B2 * | 12/2006 | Visokay et al. | 257/369 |
| 2003/0039146 | A1 * | 2/2003 | Choi | 365/185.33 |
| 2003/0109121 | A1 * | 6/2003 | Rotondaro | 438/592 |
| 2003/0111686 | A1 * | 6/2003 | Nowak | 257/328 |
| 2004/0002185 | A1 * | 1/2004 | Takahashi | 438/224 |
| 2004/0238859 | A1 * | 12/2004 | Polishchuk et al. | 257/274 |
| 2004/0266113 | A1 * | 12/2004 | Kirkpatrick et al. | 438/275 |
| 2004/0266153 | A1 * | 12/2004 | Hu | 438/592 |
| 2005/0258468 | A1 * | 11/2005 | Colombo et al. | 257/314 |
| 2005/0258500 | A1 * | 11/2005 | Colombo et al. | 257/412 |
| 2006/0011996 | A1 * | 1/2006 | Wu et al. | 257/412 |

OTHER PUBLICATIONS

B. Cheng, et al.; "Metal Gates for Advanced Sub-80 nm SOI CMOS Technology"; 2001 IEEE Intl. SOI Conference; pp. 91-92.

* cited by examiner

*Primary Examiner*—Zandra V. Smith
*Assistant Examiner*—Khanh Duong
(74) *Attorney, Agent, or Firm*—W. James Brady, III; Frederick J. Telecky, Jr.

(57) ABSTRACT

The present invention provides a method of manufacturing a semiconductor device. The semiconductor device (100), among other possible elements, includes a first transistor (120) located over a semiconductor substrate (110), wherein the first transistor (120) has a gate electrode (135) that includes a metal silicide layer 135a over which is located a silicon gate layer (135b) together which have a work function associated therewith, and a second transistor (125) located over the semiconductor substrate (110) and proximate the first transistor (120), wherein the second transistor (125) also includes a gate electrode (160) that includes a metal silicide layer (160a) over which is located a silicon gate layer (160b) together which have a different work function from that of the first gate electrode (135) associated therewith.

14 Claims, 9 Drawing Sheets

METHOD FOR MANUFACTURING DUAL WORK FUNCTION GATE ELECTRODES THROUGH LOCAL THICKNESS-LIMITED SILICIDATION

TECHNICAL FIELD OF THE INVENTION

The present invention is directed, in general, to a semiconductor device and, more specifically, a method of using a thin gate layer, comprising silicon, to form a semiconductor device having dual work function gate electrodes and a method for manufacturing an integrated circuit including the same.

BACKGROUND OF THE INVENTION

Metal gate electrodes are currently being investigated to replace polysilicon gate electrodes in todays ever shrinking and changing transistor devices. One of the principal reasons the industry is investigating replacing polysilicon gate electrodes with metal gate electrodes is to solve polysilicon depletion effects for future CMOS devices. Traditionally, polysilicon gate electrodes with overlying silicides have been used for the gate electrodes in CMOS devices. However, as device feature sizes continue to shrink, polysilicon depletion is becoming of greater concern.

To address these problems, metal gates have been proposed. One process that has been used is a full silicidation process (FUSI), which involves the use of a metal to fully silicide a conventional polysilicon gate. Examples of the metal used in the FUSI process include nickel and cobalt. However, this FUSI process is not without its own problems. For example, while the nickel silicide has worked well on larger line widths, it is believed that the industry will begin experiencing nucleation problems of the nickel as line widths continue to shrink. Also, there is the risk that a reaction of all lines across the entire wafer will not occur down to the gate/gate oxide interface. Further, excessive silicon consumption in the source/drain regions results from the thermal processes required to fully silicide the gate to the gate/gate oxide interface.

Further, to optimize the threshold voltage ($V_t$) in CMOS devices, metals with the appropriate work functions (e.g., from the silicon valence band to that of the conduction band) are required. For instance, the metal gates need tunable work functions for NMOS and PMOS devices similar to present polysilicon gate technology, requiring the work functions of metal gates to range from 4.1~4.4 eV for NMOS and 4.8~5.2 eV for PMOS.

Unfortunately, both material and processing issues arise while attempting to manufacture metal gates having different work functions, a couple of which have been described above. In addition to those problems, another exemplary problem is that different metal gate material is used for the NMOS devices and the PMOS devices. Unfortunately, the integration of two different metals in a CMOS device flow is difficult, for example requiring significant changes to the CMOS process flow. Ideally, a single metal-containing layer would be preferred, with a portion of the single metal-containing layer being exposed to a specific process to adjust the work function of the exposed portion. This, however, is a difficult technique to perfect.

Accordingly, what is needed is a method for manufacturing metal gate structures for CMOS devices that provides better control of the silicidation process and without experiencing the drawbacks of the prior art methods.

SUMMARY OF THE INVENTION

To address the above-discussed deficiencies of the prior art, the present invention provides a method for manufacturing a semiconductor device. In one embodiment, the method includes forming a first gate layer, comprising silicon, over a dielectric layer located over a semiconductor substrate, depositing a metal-containing layer over the first gate layer, forming a metal silicide layer from the first gate layer and the metal-containing layer, and placing a second gate layer that also comprises silicon, over the metal silicide layer, wherein a thickness of the second gate layer is greater than the first gate layer.

The present invention, in another embodiment provides a method for manufacturing an integrated circuit. In this embodiment, the method includes forming transistors over a semiconductor substrate, including; forming a first gate layer, comprising silicon, over a dielectric layer located over a semiconductor substrate; depositing a metal-containing layer over the first gate layer; forming a metal silicide layer from the first gate layer and the metal-containing layer; and placing a second gate layer, comprising silicon, over the metal silicide layer wherein a thickness of the second gate layer is greater than the first silicon gate layer. The method further includes patterning the metal silicide layer and the second gate layer to form gates, and forming interconnects within dielectric layers located over the transistors to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
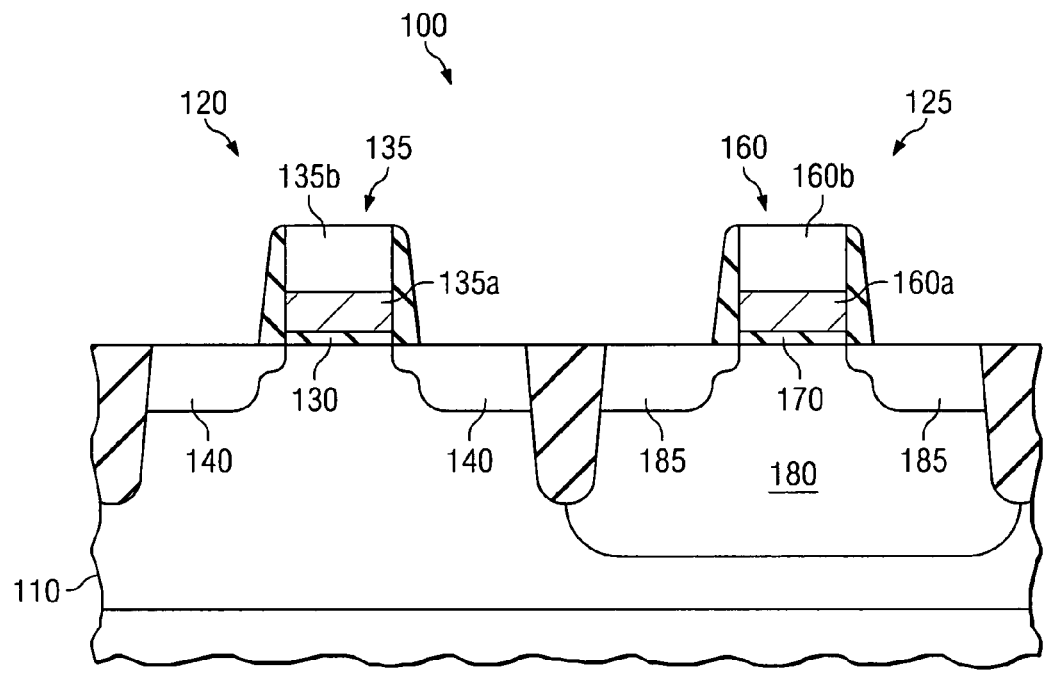
FIG. 1 illustrates a sectional view of one embodiment of a semiconductor device constructed according to the principles of the present invention.

Referring initially to FIG. 1, illustrated is a sectional view of one embodiment of a semiconductor device 100 constructed according to the principles of the present invention. In the embodiment illustrated in FIG. 1, the semiconductor device 100 includes a semiconductor substrate 110, and transistors 120, 125 are located over the semiconductor substrate 110. As illustrated, the first and second transistors 120, 125, are also located proximate one another. In an exemplary embodiment of the invention, the first transistor 120 may be an N-channel metal oxide semiconductor (NMOS) device and the second transistor 125 may be a P-channel metal oxide semiconductor (PMOS) device that together form a dual gate, complementary device. As one skilled in the art can appreciate, however, other device configurations are also within the scope of the present invention.

In the illustrative embodiment shown in FIG. 1, the first transistor 120 includes a gate 135 that is located over a gate dielectric 130. The gate 135 comprises a metal silicide layer 135a over which is located a layer 135b that contains silicon. The metal silicide layer 135a preferably comprises a transition metal selected from Columns 3, 4, 5, 6, 7, 9, or alloys thereof, of the Periodic Table. As explained in more detail below, the metal silicide layer 135a is uniquely fabricated from a thin silicon-container layer that is initially deposited over the gate dielectric 130, after which, a transition metal is deposited and annealed to form the metal silicide layer 135a. The layer 135b is preferably a polysilicon, but it may also be an amorphous silicon or silicon germanium (SiGe).

The gate 135 is tailored to have a desired work function. The term work function, as used throughout this document, is intended to be the minimum energy required to bring an electron from the Fermi level to the vacuum level. In the embodiment of FIG. 1, the work function of the metal silicide layer 135a is tailored for an NMOS device, and therefore, should optimally range from about 4.1 eV to about 4.4 eV, however, this depends on the base material of the substrate 110. In addition to the inherent work function of the particular metal used to form the metal silicide layer 135a and the silicon-containing layer 135b, an additional dopant may be included in either one or both of these layers to further tailor the work function. For example, where the device is an NMOS device, phosphorous, arsenic, or antimony could conceivably be used to further tailor the work function. Alternatively, if the device is a PMOS device, boron or indium could be used to further adjust the work function.

The transistor 120 of FIG. 1 further includes conventional source/drains 140 located within the semiconductor substrate 110. The source/drains 140 may include lightly doped source/drain implants as well as heavily doped source/drain implants. Other conventional features, which are neither discussed herein nor illustrated in FIG. 1, may also be included within the first transistor 120.

As indicated previously, located proximate the first transistor 120 is a second transistor 125. The second transistor 125 also includes a gate 160. In one embodiment, the gate 160 is located over a gate dielectric 170. The gate 160 comprises a metal silicide layer 160a over which is located a layer 160b that contains silicon. The metal silicide layer 160a preferably comprises a transition metal selected from Columns 3, 4, 5, 6, 7, 9, or alloys thereof, and in one embodiment, is comprised of the same silicide as the metal silicide layer 135a. However, in another embodiment, as discussed below, the metal silicide layer 160a is comprised of a different metal silicide. The metal silicide layer 160a is also uniquely fabricated from a thin layer, comprising silicon, which is initially deposited over the gate dielectric 170, after which a transition metal is deposited and then annealed to form the silicide layer 160a. The layer 160b is preferably a polysilicon, but it may also be an amorphous silicon or silicon germanium (SiGe).

The metal silicide layer 160a has a given work function that, in one embodiment, is different from the work function of the gate 135, and in such instances, forms a dual gate, complementary device. In the embodiment of FIG. 1, the work function of the metal silicide layer 160a is tailored for a PMOS device, and therefore, the work function should optimally range from about 4.8 eV to about 5.2 eV in those embodiments where the substrate 110 is silicon. In addition to the inherent work function of the particular metal used to form the metal silicide layer 160a and the layer 160b, an additional dopant may be included in either one or both of these layers to further adjust the work function. For example, where the device is an NMOS device, phosphorous, arsenic, or antimony could be used to further tailor the work function. Alternatively, if the device is a PMOS device, then boron or indium could be used to further adjust the work function.

The second transistor 125 of FIG. 1 further includes a conventional well region 180 formed in the semiconductor substrate 110. In this embodiment the well region 180 is an N-well region, however, the well region 180 could be a P-well region if the second transistor 125 were an NMOS device. Located within the well region 180 are conventional source/drains 185. As mentioned before, the source/drains 185 may include lightly doped source/drain implants as well as heavily doped source/drain implants. Again, other conventional features, which are neither discussed herein nor illustrated in FIG. 1, may also be included within the second transistor 125.

Figure 2:
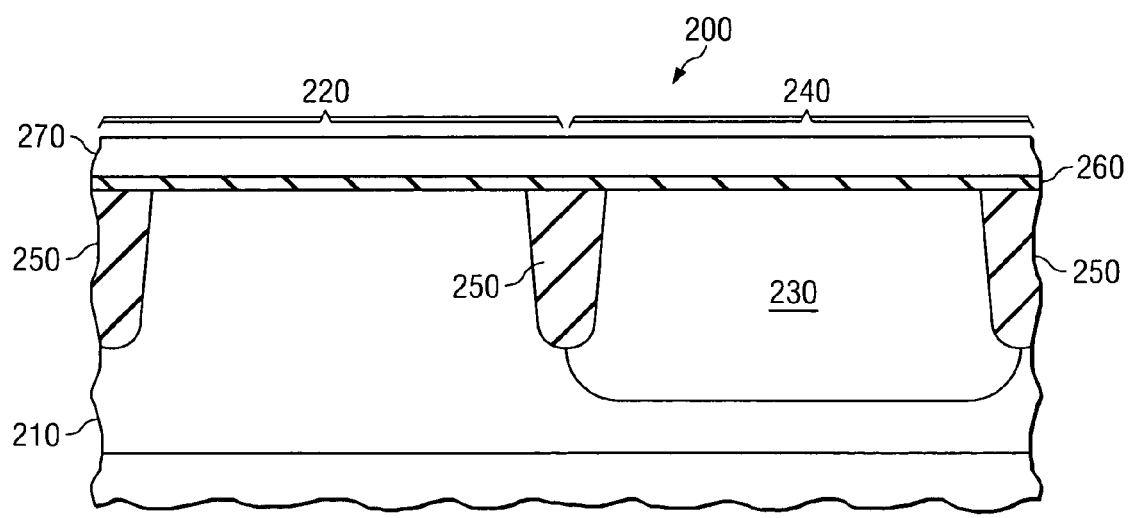
FIG. 2 illustrates a sectional view of a partially completed semiconductor device manufactured in accordance with the principles of the present invention following the deposition of a first gate layer.

Turning to FIGS. 2-7, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200. The partially completed semiconductor device 200 includes a semiconductor substrate 210. The semiconductor substrate 210 may, in an exemplary embodiment, be any layer located in the partially completed semiconductor device 200, including a wafer itself or a layer located above the wafer (e.g., epitaxial layer, silicon layer of a silicon-on-insulator (SOI) substrate, or another substrate). In the embodiment illustrated in FIG. 2, the semiconductor substrate 210 is a P-type substrate; however, one skilled in the art should understand that the semiconductor substrate 210 could be an N-type substrate. Moreover, it should be understood that each of the dopant types described throughout the remainder of this document might be reversed. For clarity, no further reference to this opposite scheme will be discussed.

The embodiment of the partially completed semiconductor device 200 illustrated in FIG. 2, includes two device regions. At this point, it should be noted that for discussion purposes, reference will be made to a dual gate, complementary device. However, the present invention is also applicable to non-complementary devices as well. The two device regions consist of an NMOS device region 220 and a PMOS device region 240. The PMOS device region 240 illustrated in FIG. 2 currently includes a conventional well region 230. The well region 230, in light of the P-type semiconductor substrate 210, would contain an N-type dopant. For example, the well region 230 would likely be doped with an N-type dopant with the dose ranging from about 1E13 atoms/cm$^2$ to about 1E14 atoms/cm$^2$ and the energy ranging from about 100 keV to about 500 keV. This results in the well region 230 having a peak dopant concentration ranging from about 5E17 atoms/cm$^3$ to about 1E19 atoms/cm$^3$. In the embodiment of FIG. 2, the P-type semiconductor substrate 210 acts as the well region for the NMOS device region 220 and is doped to conventional concentrations.

Extending into the semiconductor substrate 210 and separating the NMOS device region 220 and the PMOS device region 240 are conventionally formed isolation structures 250. The isolation structures 250 may comprise any known or hereafter discovered isolation structure. For instance, while the isolation structures 250 of FIG. 2 are illustrated as shallow trench isolation structures, the isolation structures 250 could have just as easily been LOCOS isolation structures while remaining within the scope of the present invention.

Located over the semiconductor substrate 210 is a conventionally formed gate dielectric layer 260. The gate dielectric layer 260 may be comprised of a well known material. For example, the gate dielectric layer 260 may comprise silicon dioxide (SiO$_2$), nitrided silicon oxide, a high dielectric constant (high-K) material, or stacks or combinations thereof. In the illustrative embodiment of FIG. 2, however, the gate dielectric layer 260 is a thermally grown silicon dioxide layer.

Any one of a plurality of manufacturing techniques can be used to form the gate dielectric layer 260. For example, the blanket layer of gate dielectric layer 260 may be either grown or deposited. Additionally, the growth or deposition steps may require a significant number of different temperatures, pressures, gasses, flow rates, etc, well known to those skilled in the art.

Located over the gate dielectric layer 260 is a first gate layer 270, comprising silicon. The first gate layer 270 is formed by a deposition process, such as by a chemical vapor deposition (CVD) process, and in one embodiment is a deposited poly crystalline silicon. Other silicon based materials, such as amorphous silicon or SiGe may also be used to form the first gate layer 270. The thickness of the first gate layer 270 may vary, but in an advantageous embodiment, it should be kept relatively thin in order to maintain proper control over the silicidation process and insure its full silicidation. For example, in one range of embodiments, its thickness may range from about a monolayer to about 30 nm. Although in an exemplary embodiment, the thickness of the first gate layer 270 is about 20 nm. The first gate layer 270 may be formed directly on or over the gate dielectric 260. In an exemplary implementation, the first gate layer 270 is formed via low temperature CVD using silane and N2 or H2 or other inert carrier gas.

Figure 3:
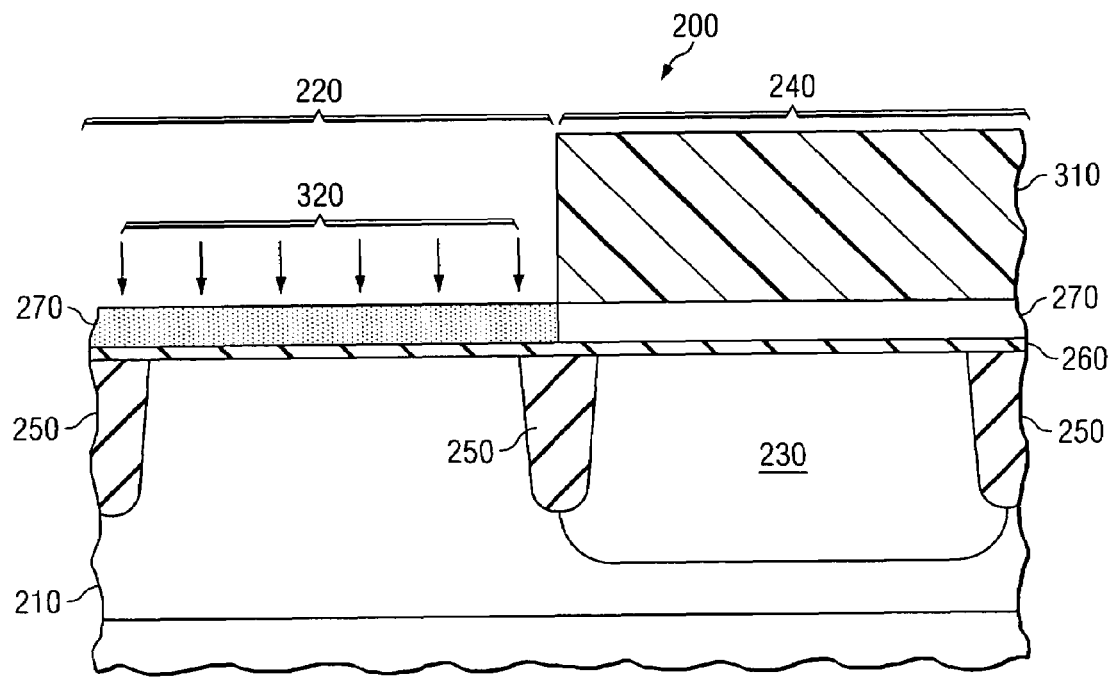
FIG. 3 illustrates a sectional view of the partially completed semiconductor device shown in FIG. 2 after forming a masking layer over portions of the first gate layer and during an optional doping of the exposed portion of the first gate layer.

Turning now briefly to FIG. 3, there is shown a sectional view of an alternative embodiment of the present method. In this view, the portion of the first gate layer 270 overlaying the NMOS region 220 is shown undergoing an optional doping step. Depending on the type of the device, the dopant may be either an n-type dopant or a p-type dopant. This optional implantation can be used to further adjust or set the gate work functions of the NMOS or PMOS transistors. Preferably the work functions are set without implanted species penetrating the gate dielectric layer 260, which the use of the first gate layer 270 helps to accomplish.

As seen, a conventional mask 310 has been patterned to expose a portion of the first gate layer 270 to the doping species, and the optional doping implantation step indicated by arrows 320 is conducted. The doping concentration at this stage may range from about 1E18 atoms/cm$^3$ to about 1E21 atoms/cm$^3$, with a concentration of 1E20 atoms/cm$^3$ being preferred. The implantation parameters are not given here since those who are skilled in the art would understand how to adjust the implantation parameters to achieve the desired doping concentration. After the doping step is completed, the mask 310 is removed. It should be understood that the portion of the first gate layer 270 in the PMOS region 240 may also be doped if so desired. In such instances, the same implantation procedures could be implemented to achieve the desired dopant concentration, using, of course, a dopant opposite to the one used to implant the first gate layer 270 in the NMOS region 220.

Figure 4A:
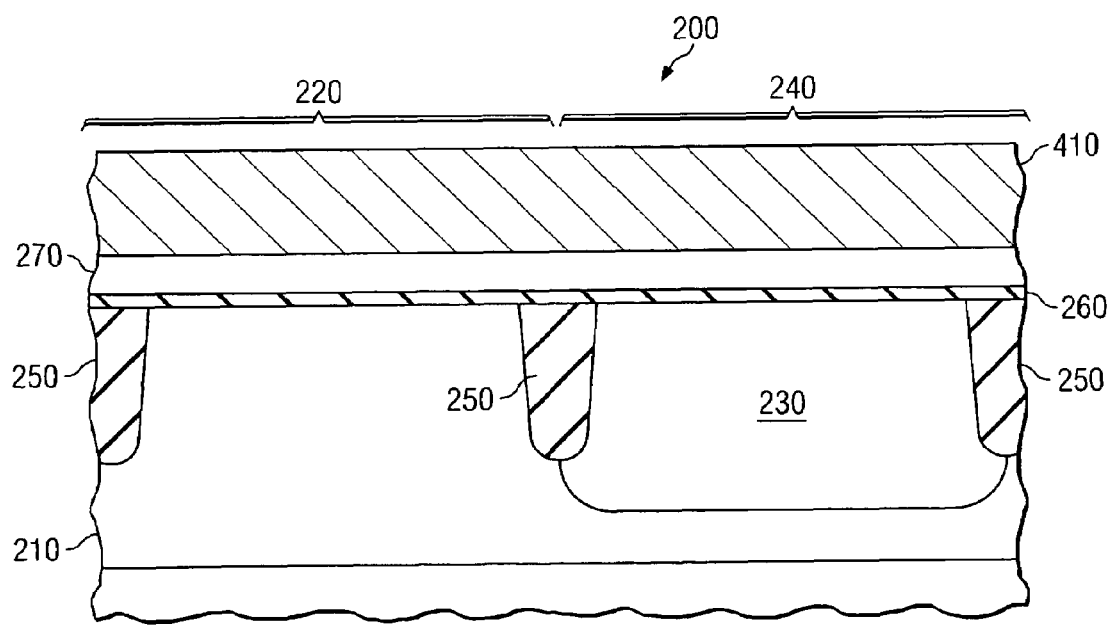
FIG. 4A illustrates a sectional view of the partially completed semiconductor device shown in FIG. 3 after the optional doping of the exposed portion of the first gate layer and deposition of a metal-containing layer.

Turning now to FIG. 4A, illustrated is a cross-sectional view of the partially completed semiconductor device 200 after the deposition of a metal-containing layer 410. The metal-containing layer 410 may be formed using any suitable metal deposition process known to those skilled in the art, such as CVD, physical vapor deposition (PVD), or atomic layer deposition (ALD) processes. In an advantageous embodiment, the metal comprising the metal-containing layer 410 is a transition metal, or alloy thereof, selected from Columns 3, 4, 5, 6, 7, or 9 of the Periodic Table. For example, the metal may be yttrium, molybdenum, tungsten, tantalum, zirconium, titanium, rhenium, rhodium, iridium, or hafnium. Further, it should be understood that the metal-containing layer 410 may be a metal stack or alloys of the transition metals. In the illustrated example, the metal is deposited over the first gate layer 270 to a thickness selected to fully silicide the first gate layer 270. For example, the thickness of the metal-containing layer 410 may range from about a monolayer up to 50 nm. In a preferred embodiment, the thickness of the metal-containing layer 410 is such that all of the first gate layer 270 is consumed during the subsequent silicidation anneal; that is, the first gate layer 270 is fully reacted or consumed so that there is silicide at the bottom interface with the gate dielectric layer 260. In a preferred embodiment, the thickness of the metal-containing layer 410 is such that an unsilicided portion of the metal-containing layer 410 remains after the silicidation anneal.

Figure 4B:
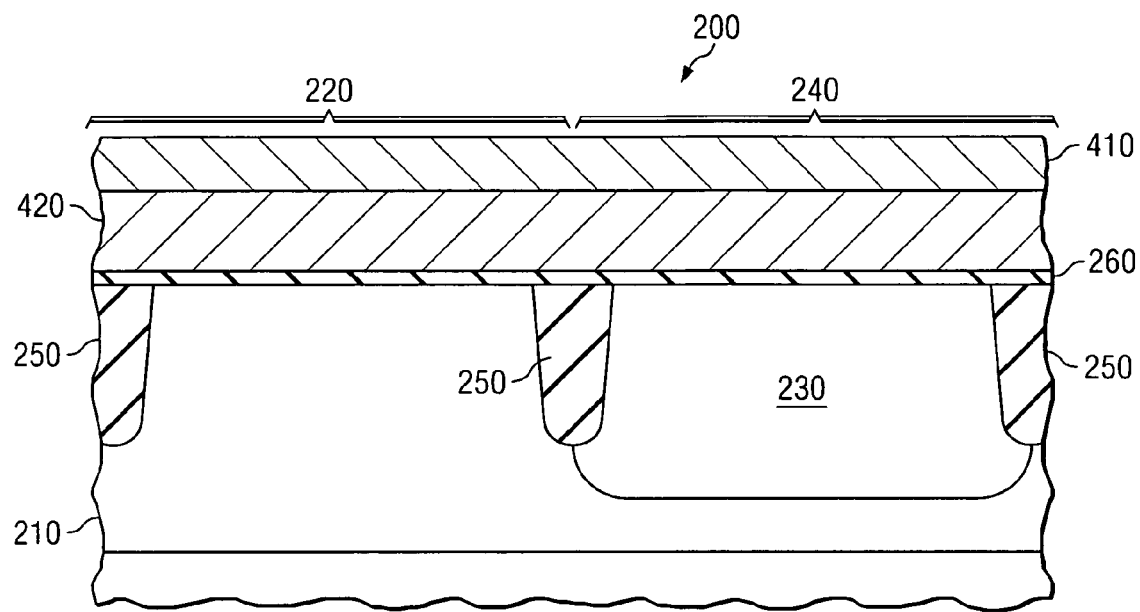
FIG. 4B illustrates a sectional view of the device of FIG. 4A after an anneal step that forms a metal silicide layer from the metal-containing layer and the first gate layer.

Turning now to FIG. 4B, there is illustrated a sectional view of the device of FIG. 4A after conducting a silicidation anneal process. During this anneal, the metal-containing layer 410 and the first gate layer 270 are reacted via a thermal anneal process to form a metal silicide layer 420. The anneal parameters may vary depending on the materials and the thicknesses of the layers used. Examples of some of the anneal parameters include annealing at a temperature ranging from about 350° C. to about 1000° C. for a period of time ranging from about 5 seconds to about 10 minutes. The anneal may be performed in a single step or multi-step process, where a second anneal may occur after the unsilicided portion of the metal-containing layer 410 is removed. In the embodiment illustrated in FIG. 4B, the metal-containing layer 410 is not completely consumed. In such embodiments, the unsilicided portion of the metal-containing layer 410 is conventionally removed following the silicidation anneal process. In other embodiments, as mentioned above, the thickness of the first gate layer 270 and the metal-containing layer 410 may be selected such that the metal-containing layer 410 is completely consumed during the silicidation process. Preferably, however, the first gate layer 270 is completely consumed, and there is silicide at the interface with the gate dielectric 260.

Figure 4C:
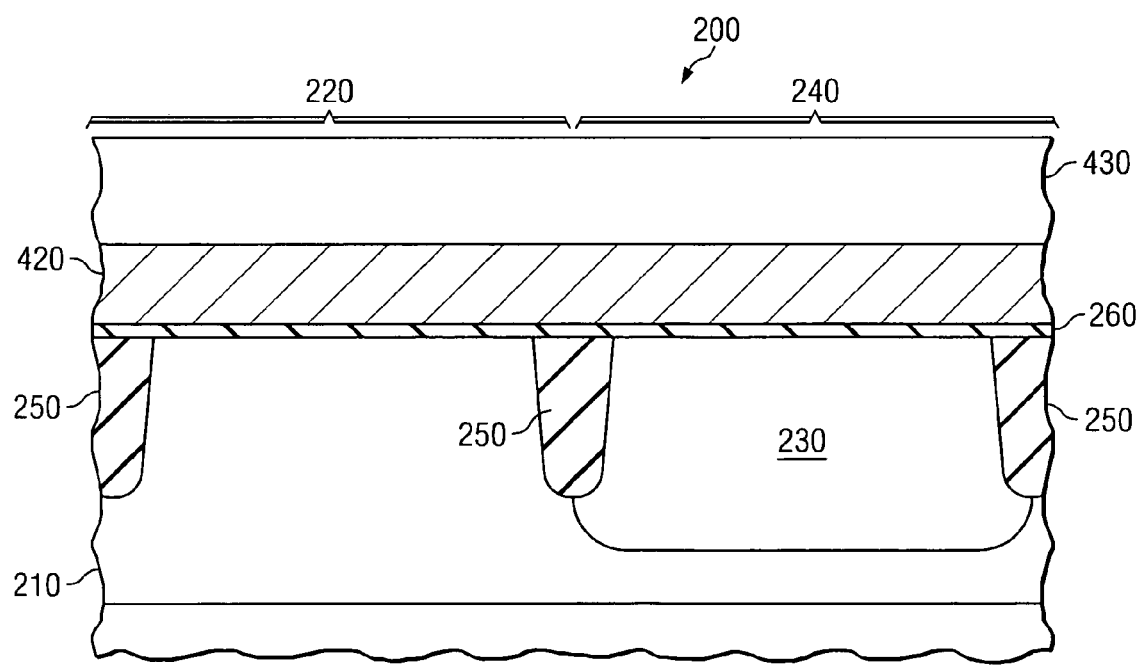
FIG. 4C illustrates a sectional view of the device of FIG. 4B after the deposition of a second gate layer having a thickness greater than the first gate layer.

Turning now to FIG. 4C, there is illustrated a sectional view of the device 200 of FIG. 4B following the removal of the unsilicided portion of the metal-containing layer 410 and the deposition of a second gate layer 430 that also comprises silicon. The second gate layer 430 is formed by a deposition process, such as by CVD, and in one embodiment it is a deposited poly crystalline silicon. Other silicon based materials, such as amorphous silicon or SiGe, may also be used to form the second gate layer 430. The thickness of the second gate layer 430 may vary. For example, the thickness of the second gate layer 430 may range from about 10 nm to about 100 nm, and it is preferably thicker than the first gate layer 270 of FIG. 4A. The second gate layer 430 may be formed directly on or over the metal silicide layer 420, and some embodiments may include one or more intervening materials located between the metal silicide layer 420 and the second gate layer 430. In an exemplary implementation, the second gate layer 430 is formed via low temperature CVD using silane and N2 or H2 or other inert carrier gas.

Figure 4D:
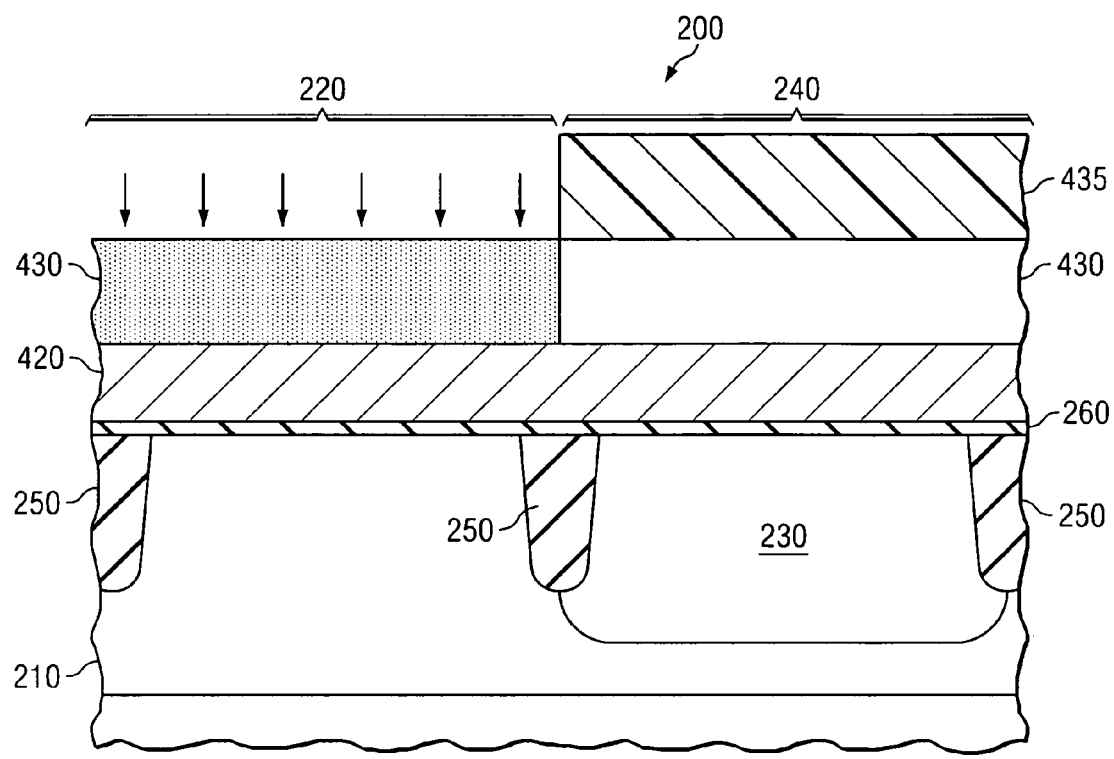
FIG. 4D illustrates a sectional view of the device of FIG. 4C showing an optional doping step of an exposed portion of the second gate layer.

FIG. 4D illustrates another embodiment of the method regarding the device of FIG. 4C. In one optional embodiment, either the NMOS region 220 or the PMOS region 240 may be masked off and the exposed region may be doped with the appropriate dopant and at the appropriate concentration to further adjust or set the work function of the ultimate gate structure. In the illustrated embodiment, the PMOS region 240 is protected by a conventional mask 435 and the NMOS region 220 is undergoing a dopant implantation step. Again, the dopant concentration may vary, depending on the device's intended application. In one aspect, the dopant concentration may range from about 1E18 atoms/cm$^3$ to about 1E21 atoms/cm$^3$. The dopant that is used depends on the type of intended device. For example, the NMOS region 220 of the second gate layer 430 will be doped with an n-type dopant, such as those mentioned above. Alternatively, the PMOS region 240 would be doped with a p-type dopant, such as boron or indium.

Figure 4E:
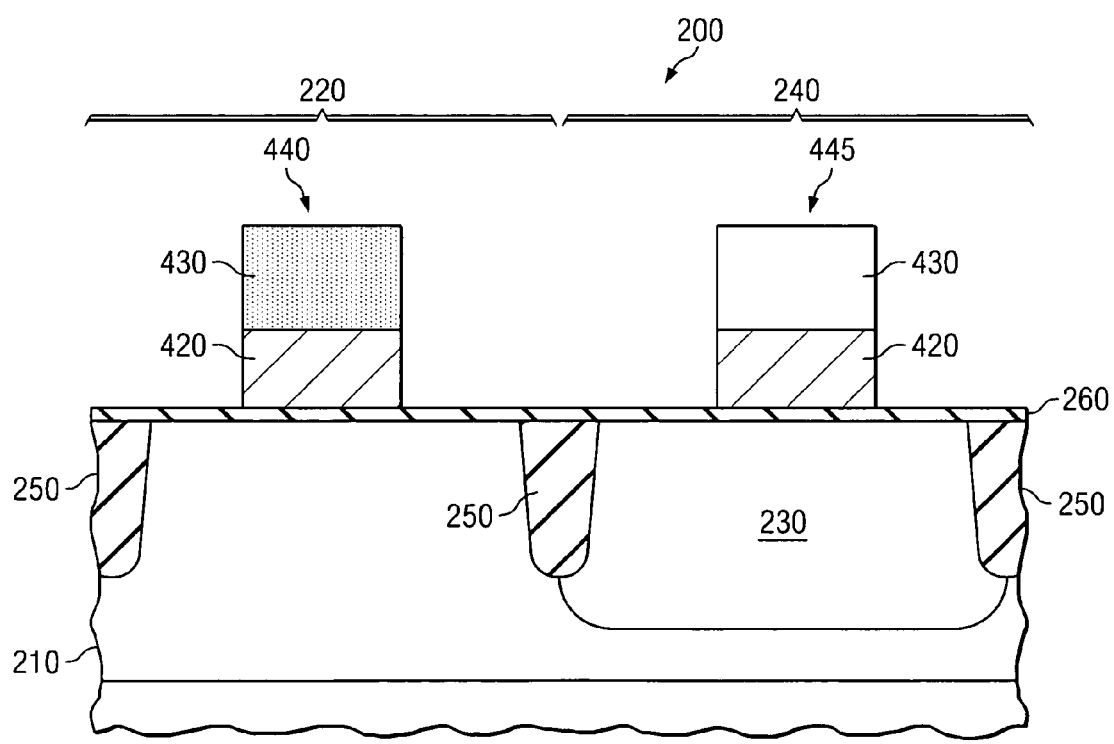
FIG. 4E illustrates a sectional view of the device of FIG. 4D after a gate etch that forms dual complementary gates.

Following the formation of the second gate layer 430 or the dopant implantation step of either one or both of the NMOS and PMOS regions 220, 240, a conventional gate etch is conducted on the metal silicide layer 420 and the second gate layer 430 to form an NMOS gate 440 and a PMOS gate 445, as shown in FIG. 4E. Another anneal step, in one embodiment, may be conducted either before or subsequent to the gate etch processes, or alternatively, the anneal may also be combined with a later conducted source/drain anneal. This anneal can be conducted to further modify the work function of gates 440, 445 of the device 200, and those who are skilled in the art, given the teachings herein, would understand how to conduct this anneal. Following the gate etch, conventional processes are used to complete the device structure as shown in FIG. 1.

Figure 5A:
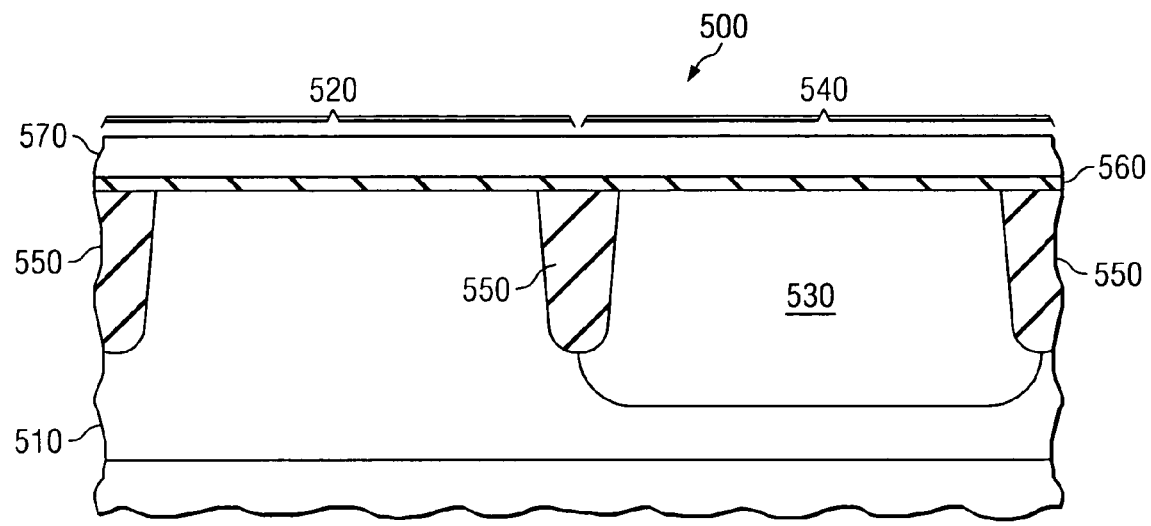
FIG. 5A illustrates a sectional view of an alternative embodiment wherein a first gate layer is formed over a gate dielectric layer.

Referring now to FIG. 5A, there is illustrated a semiconductor device 500 as provided by an alternative embodiment covered by the present invention. The partially completed semiconductor device 500 includes a semiconductor substrate 510. The semiconductor substrate 510 may, in an exemplary embodiment, be any layer located in the partially completed semiconductor device 500, including a wafer itself or a layer located above the wafer, as discussed above regarding other embodiments. In the embodiment illustrated in FIG. 5A, the semiconductor substrate 510 is a p-type substrate; however, one skilled in the art understands that the semiconductor substrate 510 could be an n-type substrate. Moreover, it should, again, be understood that each of the dopant types described throughout the remainder of this document might be reversed.

The embodiment of the partially completed semiconductor device 500 illustrated in FIG. 5A, may include two device regions. As with previously discussed embodiments, the present invention is also applicable to construction of both complementary devices as well as non-complementary devices. The two device regions consist of an NMOS device region 520 and a PMOS device region 540. The PMOS device region 540 illustrated in FIG. 5A includes a conventional well region 530. The well region 530, in light of the p-type semiconductor substrate 510, would contain an n-type dopant. For example, the well region 530 would likely be doped with an n-type dopant with the dose ranging from about 1E13 atoms/cm$^2$ to about 1E14 atoms/cm$^2$ and at an energy ranging from about 100 keV to about 500 keV. This results in the well region 530 having a peak dopant concentration ranging from about 5E17 atoms/cm$^3$ to about 1E19 atoms/cm$^3$. In the embodiment of FIG. 5A, the p-type semiconductor substrate 510 acts as the well region for the NMOS device region 520 and is doped to conventional concentrations. Extending into the semiconductor substrate 510 and separating the NMOS device region 520 and the PMOS device region 540 are conventionally formed isolation structures 550, as those discussed above regarding other embodiments.

Located over the semiconductor substrate 510 is a conventionally formed gate dielectric layer 560. The gate dielectric layer 560 may be comprised of a well known material. For example, the gate dielectric layer 560 may comprise silicon dioxide ($SiO_2$), nitrided silicon oxide, a high dielectric constant (high-K) material, or stacks or combinations thereof. In the illustrative embodiment of FIG. 5A, however, the gate dielectric layer 560 is a thermally grown silicon dioxide layer.

Any one of a plurality of known manufacturing techniques can be used to form the gate dielectric layer 560. For example, the blanket layer of gate dielectric layer 560 may be either grown or deposited. Additionally, the growth or deposition steps may require a significant number of different temperatures, pressures, gasses, flow rates, etc, well known to those skilled in the art.

Located over the gate dielectric layer 560 is a first gate layer 570, comprising silicon, which is the same as the one in those embodiments discussed above and which can be formed using the same processes. As with the other embodiments, the thickness of the first gate layer 570 may vary, but in an advantageous embodiment, it should be kept relatively thin in order to maintain proper control over the silicidation process and insure complete silicidation of the first gate layer 570. For example, in one range of embodiments, its thickness may range from about a monolayer to about 30 nm. In an exemplary embodiment, however, the thickness of the first gate layer 570 is about 20 nm. The first gate layer 570 may be formed directly on or over the gate dielectric 560. In an exemplary implementation, the first gate layer 570 is formed via low temperature CVD using silane and N2 or H2 or other inert carrier gas.

At this point of manufacture, either the NMOS region 520 or the PMOS region 540 or both may undergo an optional dopant implantation step similar to the one discussed above regarding FIG. 3. Depending on the type of the device, the dopant may be either an n-type dopant or a p-type dopant. This optional implantation can be used to further adjust or set the gate work functions of the NMOS or PMOS transistors. As before, preferably, the work functions are set without implanted species penetrating the gate dielectric layer 560. The use of the first gate layer 570 helps to accomplish this. The dopant concentration at this stage may range from about $1E18$ atoms/cm$^3$ to about $1E21$ atoms/cm$^3$, with a concentration of about $1E20$ atoms/cm$^3$ being preferred. The implantation parameters, again, are not given here since those who are skilled in the art would understand how to adjust the implantation parameters to achieve the desired doping concentration.

Figure 5B:
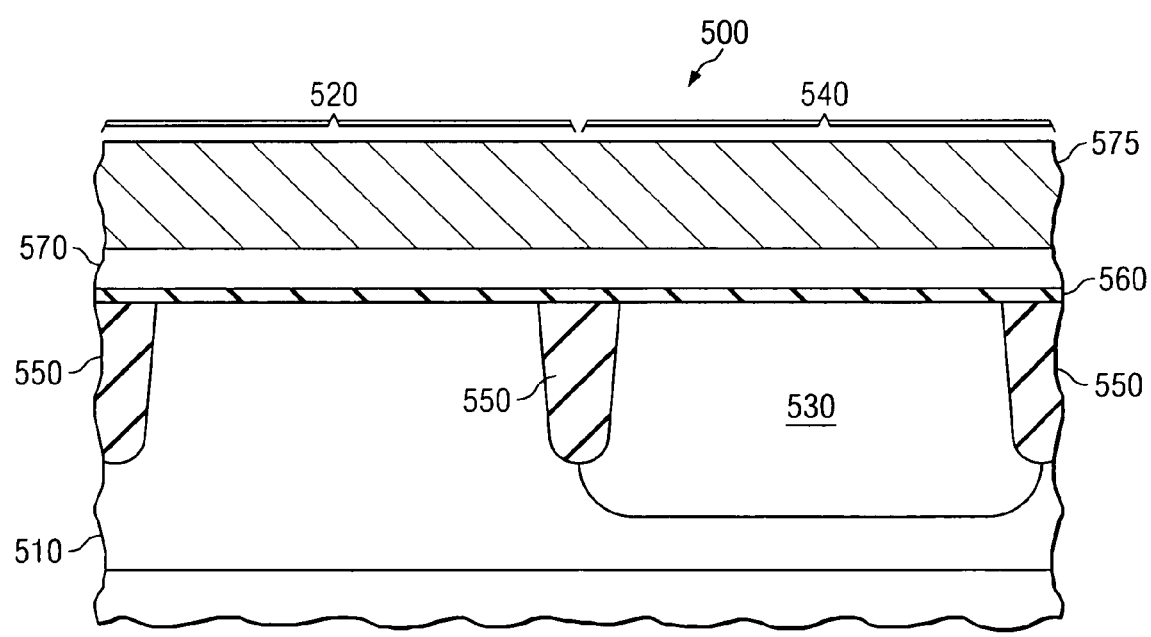
FIG. 5B illustrates a sectional view of the device of FIG. 5A after the deposition of a first metal-containing layer.
Figure 5C:
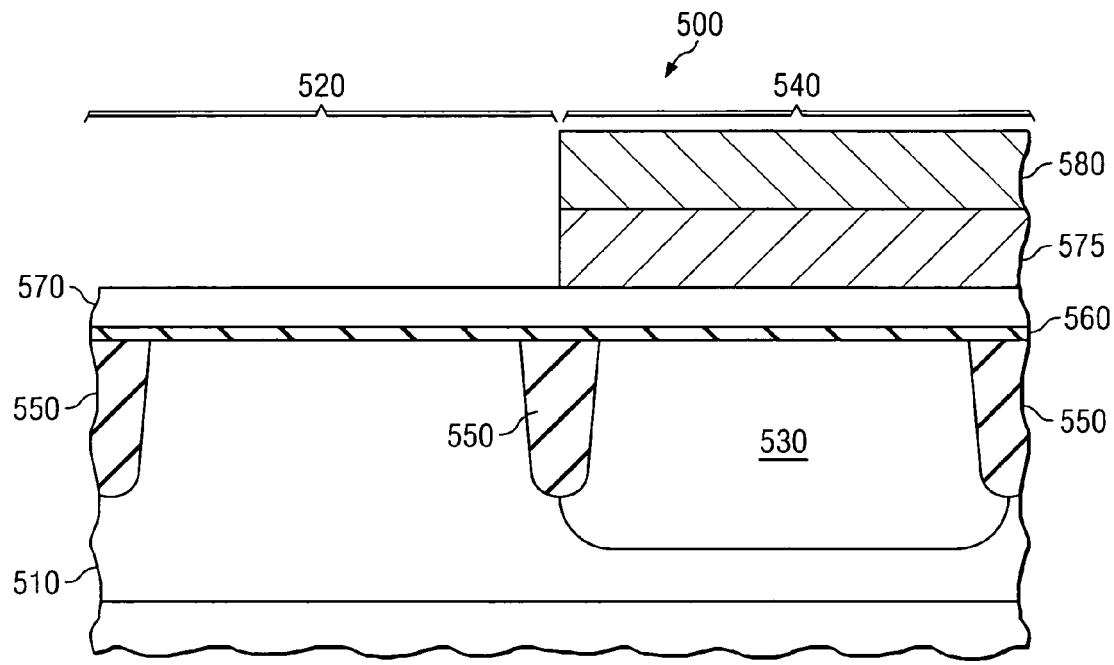
FIG. 5C illustrates a sectional view of the device of FIG. 5B after the removal of a portion of the first metal-containing layer.

Turning now to FIG. 5B, following either the formation of the first gate layer 570 of the optional dopant implantation step. A first metal-containing layer 575 is deposited over the first gate layer 570. The same processes and materials previously discussed with respect to the device in FIG. 4A may also be used in this embodiment. At this point, the first metal-containing layer 575 is then protected with a mask 580 and patterned using conventional techniques to remove the portion of the metal-containing layer 575 and expose the first gate layer 570 in the NMOS region 520, as shown in FIG. 5C. If the optional dopant implantation discussed above regarding FIG. 5A was not conducted, then that optional dopant implantation step can be conducted to dope the exposed portion of the first gate layer 570 at this point in the manufacturing process. The mask 580 is then removed and conventional fabrication processes are used form that point forward to complete the fabrication process.

Figure 5D:
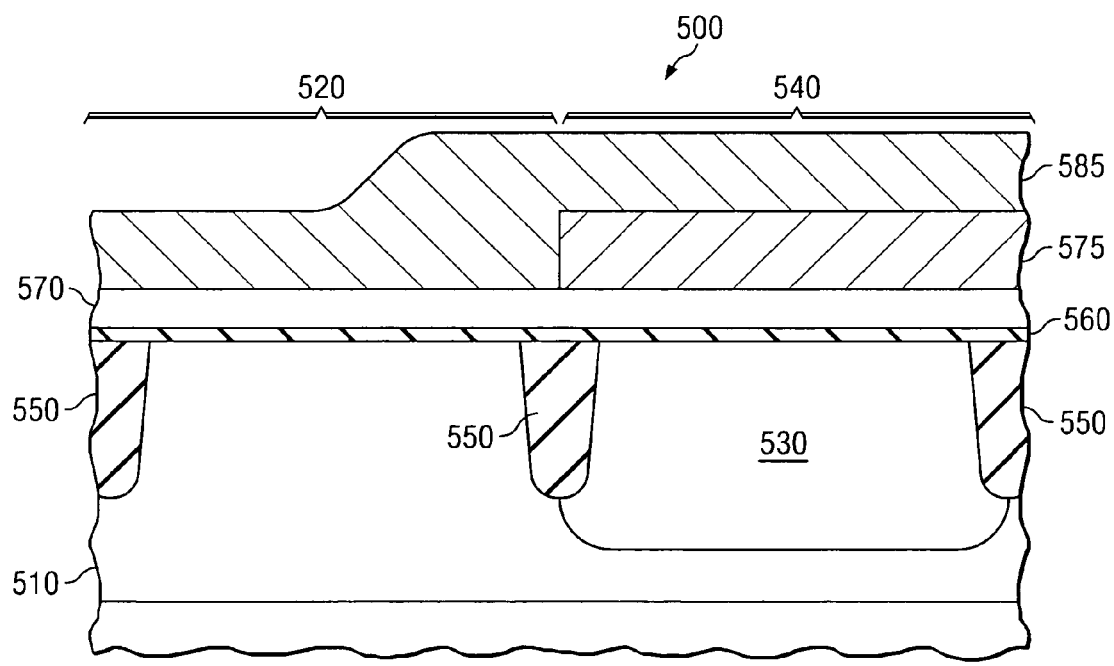
FIG. 5D illustrates a sectional view of the device of FIG. 5C after the deposition of a second metal-containing layer over the exposed portion of the first gate layer and the first metal-containing layer.

Following the cleaning process, a second metal-containing layer 585 is then deposited over the exposed portion of the first gate layer 570 and over the first metal-containing layer 575 as shown in FIG. 5D. The second metal-containing layer 585 may comprise the same metal or metal alloy as the first metal-containing layer 575, or it may be different. The second metal-containing layer 585 may be formed using any suitable metal deposition process known to those skilled in the art, such as CVD, PVD, or atomic layer deposition (ALD) processes. In an advantageous embodiment, the metal comprising the metal-containing layer 585 is a transition metal, or alloys thereof, selected from Columns 3, 4, 5, 6, 7 or 9 of the Periodic Table. For example, the metal may be yttrium, molybdenum, tungsten, tantalum, titanium zirconium, rhenium, rhodium, iridium, or hafnium. Further, it should be understood that the second metal-containing layer 585 may be a metal stack or alloys of the transition metals.

In the illustrated example, the metal-containing layer 585 is deposited over the first gate layer 570 to a thickness selected to fully silicide the first gate layer 570. For example, the thickness of the metal-containing layer 585 may range from about a monolayer up to 50 nm. In one embodiment, the thickness of the metal-containing layer 585 is such that all of the first gate layer 570 is consumed during the subsequent silicidation anneal. However, in an alternative embodiment, the thickness of the metal-containing layer 585 is such that an unsilicided portion of the metal-containing layer 585 remains after the silicidation anneal. Moreover, it should be noted that the first gate layer 570 is fully reacted or consumed so that there is silicide at the bottom interface with the gate dielectric layer 560.

Figure 5E:
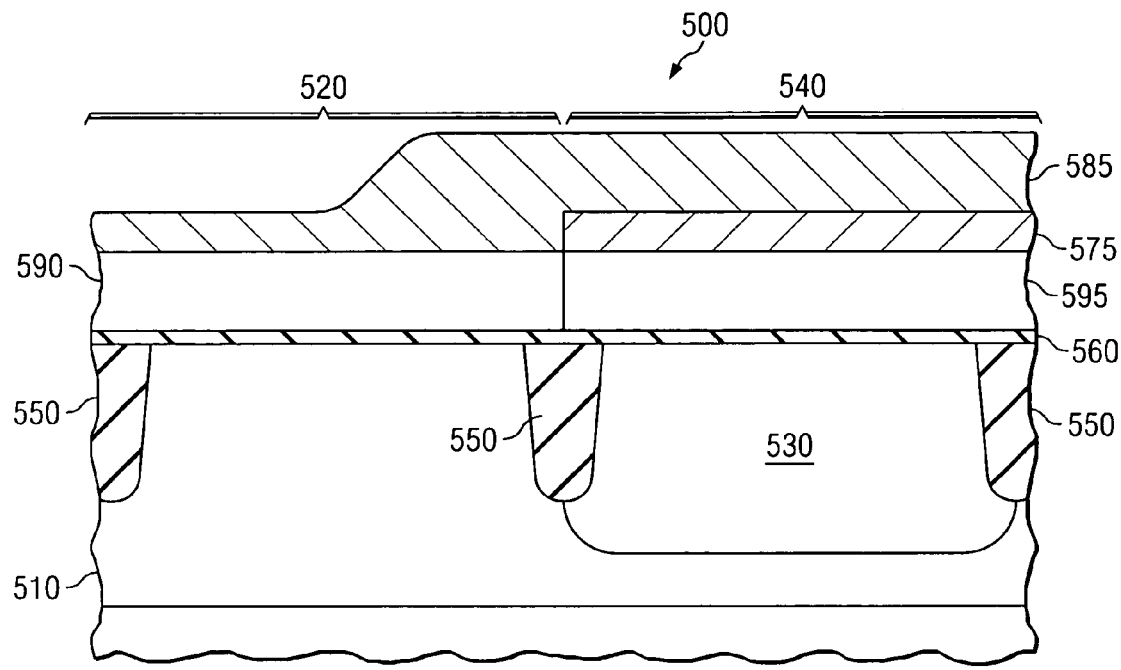
FIG. 5E illustrates a sectional view of the device of FIG. 5D after the formation of a first metal silicide layer and a second metal silicide layer.
Figure 5F:
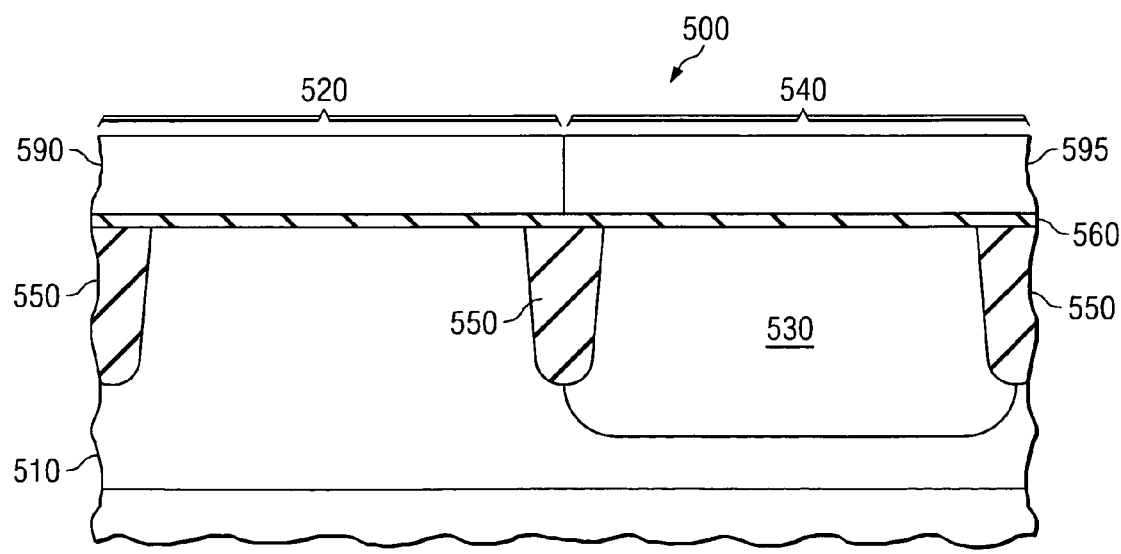
FIG. 5F illustrates a sectional view of the device of FIG. 5E after the removal of an unsilicided portion of the first and second metal-containing layers.

Turning now to FIG. 5E, the semiconductor device 500 of FIG. 5C is shown after a silicidation anneal process. As illustrated, the first gate layer 570 and the first and second metal-containing layers 575, 585, respectively, combine to form a first silicide metal-containing layer 590 over the NMOS region 520 and a second silicide metal-containing layer 595 over the PMOS region 540. As seen in this embodiment, not all of the first and second metal-containing layers, 575, 585 are consumed and an excess remains. Thus, in those instances where the metal used to form the first silicide metal-containing layer 590 is different from the metal used to form the second silicide metal-containing layer 595, separate conventional metal etches are conducted to remove the respective excess metal to arrive at the structure shown in FIG. 5F. Moreover, because of the presence of the different metals used in the NMOS region 520 versus the PMOS region 540, the resulting gate structures will have different work functions associated therewith, and as such, can be used to form a dual gate, complementary device.

Figure 5G:
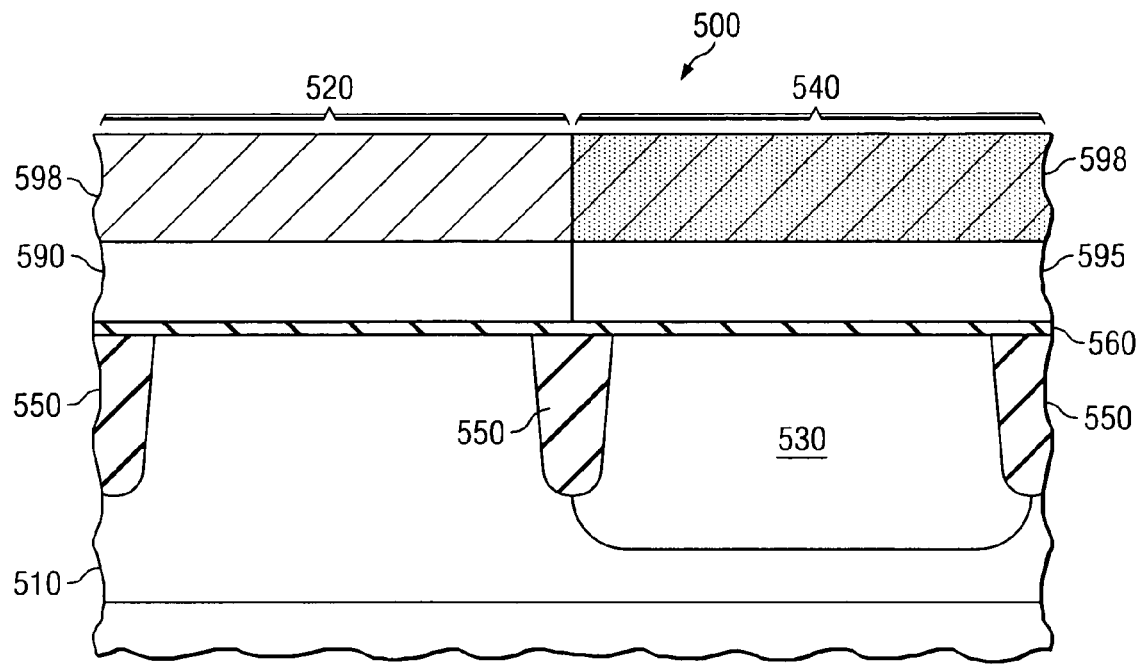
FIG. 5G illustrates a sectional view of the device of FIG. 5F after the deposition of a second gate layer and optional doping of a portion of an exposed portion of the second gate layer.

Turning now to FIG. 5G, there is illustrated a sectional view of the semiconductor device 500 after the deposition of a second gate layer 598. The second gate layer 598 is similar to the one discussed above regarding other embodiments and is formed by a deposition process, such as a CVD process, and in one embodiment, it is a deposited poly crystalline silicon. Other silicon based materials, such as amorphous silicon or SiGe, may also be used to form the second gate layer 598. The thickness of the second gate layer 598 may vary. For example, the thickness of the second gate layer 598 may range from about 10 nm to about 100 nm, but preferably it is thicker than the first gate layer 570 shown in FIG. 5D. The second gate layer 598 may be formed directly on or over the first and second metal silicide layers 590, 595. In an exemplary implementation, the second gate layer 598 is formed via low temperature CVD using silane and N2 or H2 or other inert carrier gas.

As with previous optional embodiments, at this point of manufacture, either the NMOS region 520 or the PMOS region 540 may be conventionally masked off, and the exposed first or second metal silicide layers 590, 595 may be doped with the appropriate dopant and at the appropriate concentration to further adjust or set the work function of the ultimate gate structure. For illustrative purposes, the portion of the second gate layer 598 over the PMOS region 540 is shown to be doped.

Figure 6:
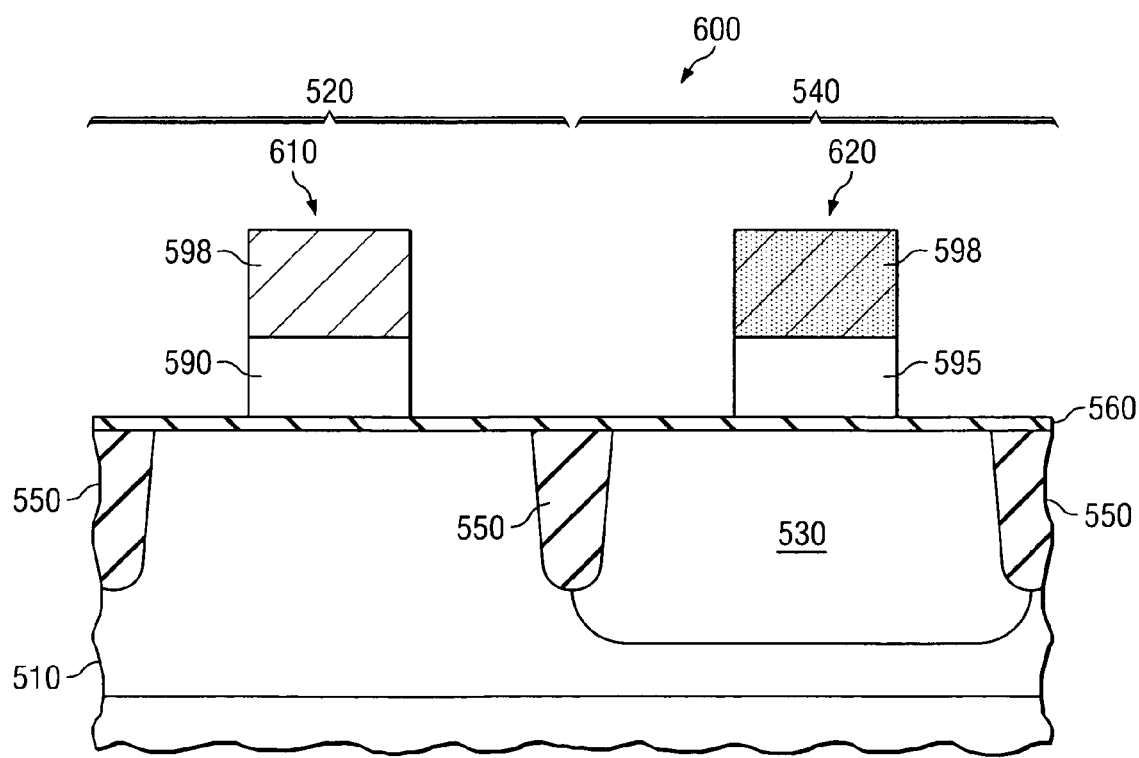
FIG. 6 illustrates a sectional view of the device of FIG. 5G after a gate etch that forms a dual, complementary gates.

Following the formation of the second gate layer 598 or the dopant implantation step of either one or both of the NMOS and PMOS regions 520, 540, a conventional gate etch is conducted on the first and second metal silicide layers 590, 595 and the second gate layer 598 to form a semiconductor device 600 having a dual complementary NMOS gate 610 and a PMOS gate 620, as shown in FIG. 6. A conventional source/drain implant typically follows the gate etch. In general, this source/drain implant can be used to further dope the gate, if necessary. In some cases, a capping layer also may or may not be used to prevent or allow further doping of the gate. Another anneal step, in one embodiment, may be conducted either before or subsequent to the gate etch processes, or alternatively, the anneal may also be combined with a source/drain anneal. This anneal is conducted to further modify the work function of gates 610, 620 of the device 600, and those who are skilled in the art, given the teachings herein, would understand how to conduct this anneal. Following the gate etch, conventional processes are used to complete the semiconductor device 600 to arrive at the structure shown in FIG. 1.

Figure 7:
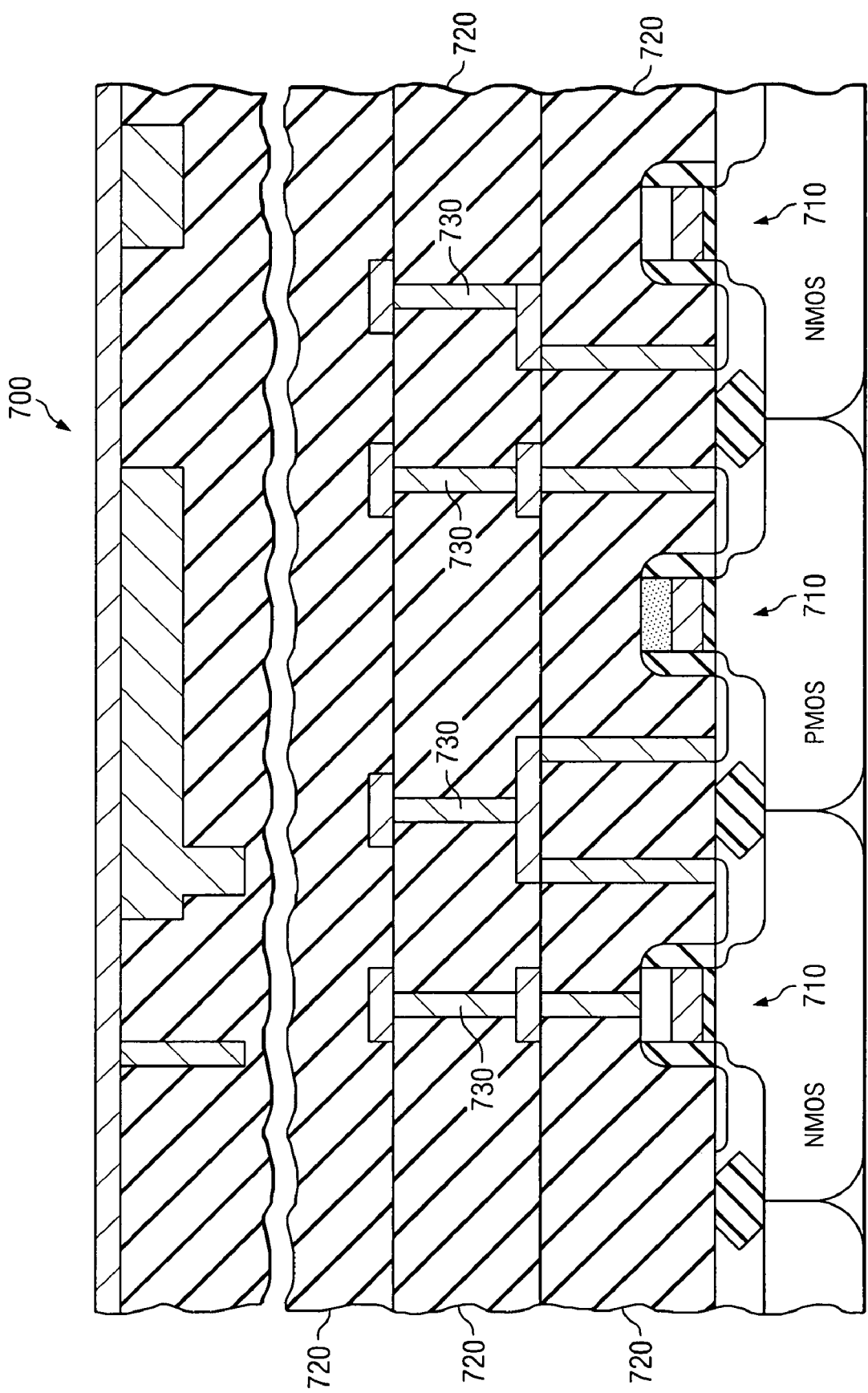
FIG. 7 illustrates an exemplary cross-sectional view of an integrated circuit (IC) incorporating devices constructed according to the principles of the present invention.

Referring finally to FIG. 7, illustrated is an exemplary cross-sectional view of a conventional integrated circuit (IC) 700 incorporating a semiconductor device 710 constructed according to the principles of the present invention. The IC 700 may include devices, such as transistors used to form CMOS devices, BiCMOS devices, Bipolar devices, as well as capacitors or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes the semiconductor devices 710 having dielectric layers 720 located thereover. Additionally, interconnect structures 730 are located within the dielectric layers 720 to interconnect various devices, thus, forming the operational integrated circuit 700.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   forming a first gate layer, comprising silicon, over a dielectric layer located over a semiconductor substrate;
   doping a first region of said first gate layer differently from a second region of said first gate layer, the first region being adjacent to the second region, such that a first work function of the first region of the first gate layer is different from a second work function of the second region of the first gate layer;
   depositing a metal-containing layer over both the first and second regions of the first gate layer;
   forming a first metal silicide layer from the first gate layer and the metal-containing layer;
   placing a second gate layer, comprising silicon, over the metal silicide layer; and
   patterning said second gate layer and said first metal silicide layer to form at least two gate structures wherein a first of said at least two gate structures comprise metal silicide formed from said first region of said first gate layer and a second of said at least two gate structures comprises metal silicide formed from said second region of said first gate layer.

2. The method as recited in claim 1 wherein said first region of said first gate layer is doped n-type and said second region of said first gate layer is doped p-type.

3. The method as recited in claim 1 wherein said first region of said gate layer is doped to a concentration higher than doped concentration of said second region of said first gate layer.

4. The method as recited in claim 1 further including doping a first region of said second gate layer differently from a second region of said second gate layer.

5. The method as recited in claim 4 wherein said patterning said second gate layer and said first metal silicide layer to form at least two gate structures includes forming the first gate structure with metal silicide formed from the first region of said first gate layer and said first region of said second gate layer; and
   forming the second gate structure with metal silicide formed from said second region of said first gate layer and said second region of said second gate layer.

6. The method as recited in claim 1 wherein the metal-containing layer comprises a transition metal selected from Columns 3, 4, 5, 6, 7, or 9 of the Periodic Table.

7. A method of manufacturing a semiconductor device, comprising:
   forming a first gate layer comprising silicon, with thickness from a monolayer to about 30 nm, over a dielectric layer located over a semiconductor substrate;
   depositing a metal containing layer over the first gate layer;
   forming a first metal silicide layer from the first gate layer and the metal-containing layer;
   placing a second gate layer, comprising silicon, over the metal silicide layer;
   doping a first region of said second gate layer differently from a second region of said second gate layer, the first region being adjacent to the second region, such that a first work function of the first region of the second gate layer is different from a second work function of the second region of the second gate layer; and
   patterning said second gate layer and said first metal silicide layer to form at least two gate structures wherein a first of said at least two gate structures comprises metal silicide formed from said first gate layer and said first region of said second gate layer and a second of said at least two gate structures comprises metal silicide formed from said first gate layer and said second region of said second gate layer.

8. The method as recited in claim 7 wherein said first region of said second gate layer is doped n-type and said second region of said second gate layer is doped p-type.

9. The method as recited in claim 7 wherein said first region of said second gate layer is doped to a concentration higher than doped concentration of said second region of said second gate layer.

10. A method for manufacturing a semiconductor device, comprising:
    forming a first gate layer, comprising silicon, over a dielectric layer located over a semiconductor substrate;
    doping a first region of said first gate layer differently from a second region of said first gate layer, the first region being adjacent to the second region, such that a first work function of the first region of the first gate layer is different from a second work function of the second region of the first gate layer;

depositing a first metal-containing layer comprising a first metal over the first region of said first gate layer;

depositing a second metal-containing layer comprising a second metal different from said first metal over the second region of said first gate layer;

forming first and second metal silicide layers from the first and second regions of said first gate layer and the first and second metal-containing layers;

placing a second gate layer, comprising silicon, over the first and second metal silicide layers; and patterning said second gate layer and said first metal silicide layer to form at least two gate structures wherein a first of said at least two gate structures comprises said first metal silicide and a second of said at least two gate structures comprises said second metal silicide.

11. The method as recited in claim 10 where said first region of said first gate layer is doped n-type and said second region of said first gate layer is doped p-type.

12. The method as recited by claim 10 wherein said first region of said first gate layer is doped to a concentration higher than doped concentration of said second region of said first gate layer.

13. The method as recited in claim 10 further including doping a first region of said second gate layer differently from a second region of said second gate layer.

14. The method as recited in claim 13 wherein said patterning said second gate layer includes forming the first gate structure with said first metal silicide and said first region of said second gate layer; and forming the second gate structure with said second metal silicide and said second region of said second gate layer.

* * * * *